(12) United States Patent
Lee

(10) Patent No.: US 6,698,502 B1
(45) Date of Patent: Mar. 2, 2004

(54) MICRO COOLING DEVICE

(76) Inventor: Jung-Hyun Lee, 4/3 475-1 Kwachun-Dong, Kwachun-City, Kyungki-Do 427-060 (KR)

( * ) Notice: Subject to any disclaimer, the term of this patent is extended or adjusted under 35 U.S.C. 154(b) by 0 days.

(21) Appl. No.: 09/585,361

(22) Filed: Jun. 2, 2000

(30) Foreign Application Priority Data

Jun. 4, 1999 (KR) ......................................... 1999-20681
May 2, 2000 (KR) ......................................... 2000-23505

(51) Int. Cl.⁷ ............................................. F28D 15/00
(52) U.S. Cl. .................. 165/104.26; 361/700; 257/715; 165/135
(58) Field of Search ....................... 165/104.26, 104.21, 165/104.33, 135; 361/700; 257/714, 715; 174/15.2, 16.3

(56) References Cited

U.S. PATENT DOCUMENTS

| | | | | |
|---|---|---|---|---|
| 3,563,309 A | * | 2/1971 | Basiulis .................. | 165/104.26 |
| 3,741,289 A | * | 6/1973 | Moore .................... | 165/104.26 |
| 4,012,770 A | * | 3/1977 | Pravda et al. .......... | 165/104.26 |
| 4,026,348 A | * | 5/1977 | Roberts, Jr. ............ | 165/104.26 |
| 4,322,737 A | * | 3/1982 | Sliwa, Jr. ................ | 165/104.26 |
| 4,336,837 A | * | 6/1982 | Koenig .............. | 165/104.26 X |
| 4,351,388 A | * | 9/1982 | Calhoun et al. ........ | 165/104.26 |
| 4,414,604 A | * | 11/1983 | Matsui et al. .......... | 165/104.11 |
| 4,422,501 A | * | 12/1983 | Franklin et al. ........ | 165/104.26 |
| 4,441,548 A | * | 4/1984 | Franklin et al. ........ | 165/104.26 |
| 4,470,451 A | * | 9/1984 | Alario et al. ........... | 165/104.26 |
| 4,489,777 A | * | 12/1984 | Del Bagno et al. ..... | 165/104.26 |
| 4,492,266 A | * | 1/1985 | Bizzell et al. .......... | 165/104.26 |
| 4,515,207 A | * | 5/1985 | Alario et al. ........... | 165/104.26 |
| 4,520,865 A | * | 6/1985 | Bizzell ................... | 165/104.26 |
| 4,880,053 A | * | 11/1989 | Sheyman ................ | 165/104.26 |
| 4,890,668 A | * | 1/1990 | Cima ..................... | 165/104.26 |
| 4,899,810 A | * | 2/1990 | Fredley .................. | 165/104.26 |
| 4,909,316 A | * | 3/1990 | Kamei et al. ........... | 165/104.26 |
| 5,046,553 A | * | 9/1991 | Lindner .................. | 165/104.26 |
| 5,309,986 A | * | 5/1994 | Itoh ........................ | 165/104.26 |
| 5,465,782 A | * | 11/1995 | Sun et al. ............... | 165/104.26 |
| 5,558,156 A | * | 9/1996 | Tsutsui ........................ | 165/122 |
| 5,944,092 A | * | 8/1999 | Van Oost ............... | 165/104.26 |
| 6,058,711 A | * | 5/2000 | Maciaszek et al. ..... | 165/104.26 |

FOREIGN PATENT DOCUMENTS

| | | | | |
|---|---|---|---|---|
| DE | 0936336 | * | 12/1955 | ............ 165/104.21 |
| JP | 57-84988 | * | 5/1982 | ............ 165/104.21 |
| SU | 0653497 | * | 3/1979 | ............ 165/104.26 |
| SU | 0658392 | * | 4/1979 | ............ 165/104.26 |
| SU | 0823812 | * | 4/1981 | ............ 165/104.21 |
| SU | 1017899 | * | 5/1983 | ............ 165/104.26 |

* cited by examiner

Primary Examiner—Christopher Atkinson
(74) Attorney, Agent, or Firm—Bacon & Thomas, PLLC

(57) ABSTRACT

A cooling device having a high cooling efficiency in a miniature size that is neither influenced by gravity nor restricted in its position of installation. The device exchanges, transports and dissipates heat generated by a heat source. The device includes a coolant storing part for storing liquid coolant, a heat absorbing part including at least one micro channel, the heat absorbing part is closely positioned to the heat generating source and connected to the coolant storing part. The liquid coolant is partly filled in the micro channel by surface tension and vaporized to become a gaseous coolant in the micro channel when heat is absorbed from the heat generating source. The device includes a heat insulating part positioned adjacent to the heat absorbing part to prevent the heat absorbed by the heat absorbing part from transferring to other zones. The device includes a condensing part for condensing the gaseous coolant. The condensing part is positioned apart from the heat absorbing part. The device includes a gas moving part positioned near the heat absorbing part and the condensing part, and the gas moving part includes a passage through which the gaseous coolant moves from the heat absorbing part to the condensing part. The device further includes a housing in which at least the heat absorbing part is housed.

24 Claims, 4 Drawing Sheets

MICRO COOLING DEVICE

BACKGROUND OF THE INVENTION

1. Field of the Invention

The present invention relates to a micro cooling device for discharging out unnecessary heat, and more particularly to a micro cooling device for an electronic product that generates unnecessary heat in spite of a small size of product, such as an integrated circuit device.

2. Brief Description of the Prior Art

Due to a large quantity of heat generated by an integrated circuit device like a recently developed central processing unit (CPU), the device itself and a system containing it tend to be degenerated in product reliability. Especially, in a semiconductor device, a variety of parameters are affected by the operation temperature so that their values are changed, thereby causing a problem in the device to deteriorate performances of the integrated circuit.

One representative conventional method to solve the aforementioned problem is using a fan to forcibly cool down the device. However, the aforementioned method has its own problems like a low cooling efficiency, introduction of additional heat generating source, such as a power source for the fan, and additional heat generated by the fan itself.

Another method having a higher cooling efficiency is discharging heat by changing phases of a liquid material ("coolant"). In other words, a liquid material used as a coolant is passing over a heat generating source and turning into gas to discharge heat with its vaporizing energy, which has been widely used in refrigerators and air conditioners. There is also a problem in the aforementioned method in that a variety of equipment should be additionally installed for condensing the vaporized(or gaseous) coolant, so that the bulkiness of the total system and power consumption are increased.

Recently, a very small-sized cooling device, so called a heat pipe, has been developed by applying phase changes of a liquid material and natural convection phenomenon. Even if there are a various types of heat pipes, a double-pipe type of heat pipe having internal and external pipes is introduced as an efficient cooling device. In the double-pipe type, the coolant is filled in the external pipe, and the wall of the internal pipe has a plurality of fine holes to form a passage to the external pipe from the inside of the internal pipe. When heat from a heat source is transferred to the external pipe, the coolant in the external pipe turns into gas by absorbing the heat, and the vaporized coolant is infused into the inside of internal pipe through the holes on the internal pipe. The gas in the internal pipe further moves to the opposite end of the internal pipe through differences in buoyancy and air pressure. At the opposite end of the internal pipe, the coolant is condensed into liquid. The liquid moves through the holes of the internal pipes to the external pipe and finally returns to the original place of the coolant.

The heat pipe made in the aforementioned principle is small and has a favorable cooling efficiency. However, as the movement of the gas coolant inside the pipe is dependent on differences in buoyancy and air pressure and the movement of the liquid coolant is dependent on gravity, there is a limitation on the installation position or place of the heat pipe. Furthermore, since the heat pipe should be constructed in a structure in which the coolant is condensed at the opposite end of the heat generating source, as the size of the heat pipe gets smaller, its cooling efficiency gets lower and its performance gets poorer.

SUMMARY OF THE INVENTION

Therefore, it is an object of the present invention to solve the aforementioned problems of the conventional cooling devices and to provide a micro cooling device which can be made very small, but with high cooling performances.

In addition, it is another object of the present invention to provide a cooling device of high efficiency that has no restriction in installation position or place which is not influenced by gravity.

In order to accomplish the aforementioned objects of the present invention, there is provided a cooling device which discharges out heat generated by a heat generating source, said device comprising: a coolant storing part for storing liquid coolant; a heat absorbing part comprising at least one micro channel and being positioned to be close to said heat generating source and connected to said coolant storing part, said liquid coolant being partly filled in said micro channel by surface tension and vaporized to be gaseous coolant in said micro channel when heat is absorbed from said heat generating source; a heat insulating part being adjacent to said heat absorbing part for preventing said heat absorbed by said heat absorbing part from transferring to other zones; a condensing part for condensing said gaseous coolant and being positioned apart from said heat absorbing part; a gas moving part being close to said heat absorbing part and said condensing part and being a passage through which said gaseous coolant moves from said heat absorbing part to said condensing part; and a housing in which at least said heat absorbing part is comprised.

BRIEF DESCRIPTION OF THE DRAWINGS

Objects and aspects of the invention will become apparent from the following description of an embodiment with reference to the accompanying drawings in which.

DETAILED DESCRIPTION OF THE INVENTION

Now, an embodiment of the present invention will be described with reference to the accompanying drawings.

Figure 1:
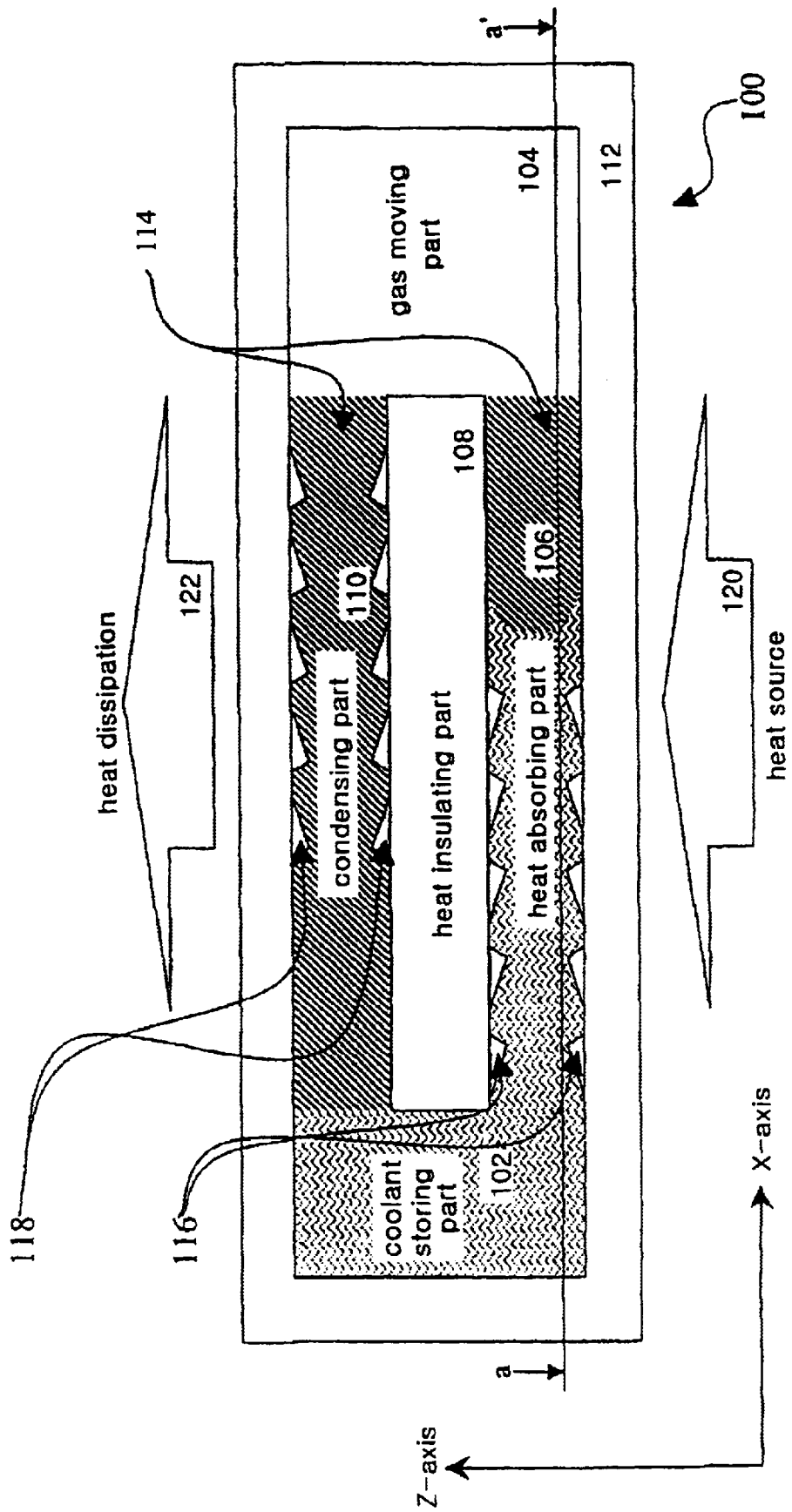
FIG. 1 is a schematic cross-sectional view for illustrating a cross-section of an XZ plane of a cooling device in accordance with an embodiment of the present invention.

FIG. 1 is a schematic cross-sectional view for illustrating a cross-section of an XZ plane of a cooling device in accordance with an embodiment of the present invention. The cooling device 100 of the present invention includes a coolant storing part 102 to store liquid coolant (indicated by wave patterns in the drawing) and a heat absorbing part 106 which is positioned close to the coolant storing part 102 and neighboring the heat generating source(not shown). The heat absorbing part 106 includes a plurality of micro channels 114 (indicated by slant lines in the drawing). The coolant stored in the coolant storing part 102 is partly filled in the micro channels 114 by surface tension of each of the micro channels according to the capillary phenomenon.

The cooling device 100 of the present invention further includes a gas moving part 104 positioned across from the coolant storing part 102 and separated by the heat absorbing part 106. The cooling device 100 also includes a heat insulating part 108 (which is a heat insulating element separate from the heat absorbing part 106 and the condensing part 110) placed adjacent to the heat absorbing part 106 for preventing heat from transferring to the other parts. The cooling device also includes a condensing part 110 positioned across from the heat absorbing part 106 and separated in Z-axis by the heat insulating part 108.

Preferably, the coolant storing part 102, the heat absorbing part 106, the gas moving part 104, the heat insulating part 108 and the condensing part 110 is formed in a housing 112, which forms an embodiment of the cooling device 100 of the present invention.

Figure 2:
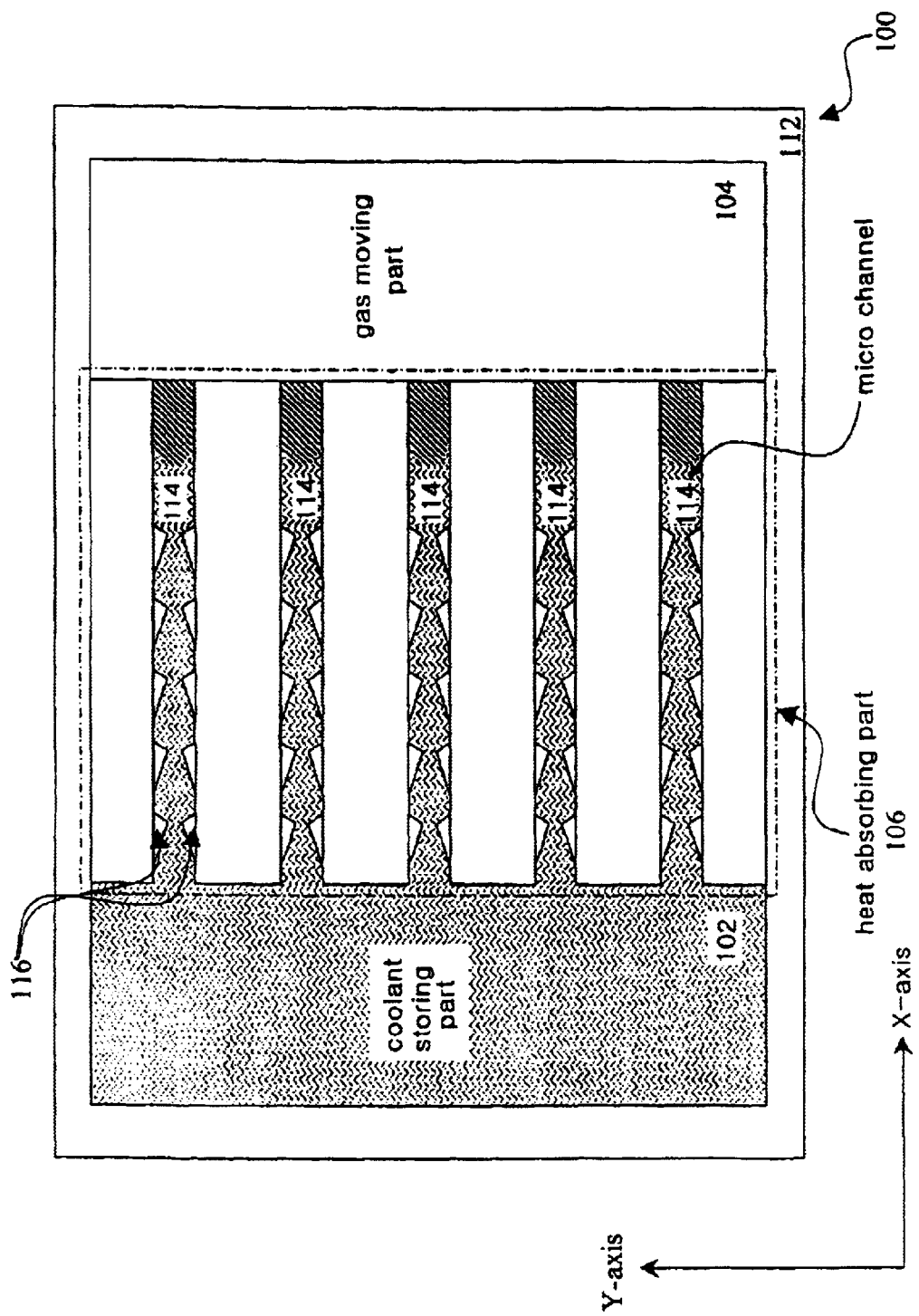
FIG. 2 is a cross-sectional view for illustrating the cooling device shown in FIG. 1 as viewed from line a–a'.

In order to more clearly describe the geometrical structure of an embodiment of the present invention, FIG. 2 is shown for a cross-sectional view of the cooling device 100 in FIG. 1 seen from line a–a'. The cooling device 100 includes a coolant storing part 102 formed apart in the X-axis from the gas moving part 104 with the heat absorbing part 106 being inserted therebetween. As mentioned, a plurality of micro channels 114 are formed in the heat absorbing part 106.

Figure 3:
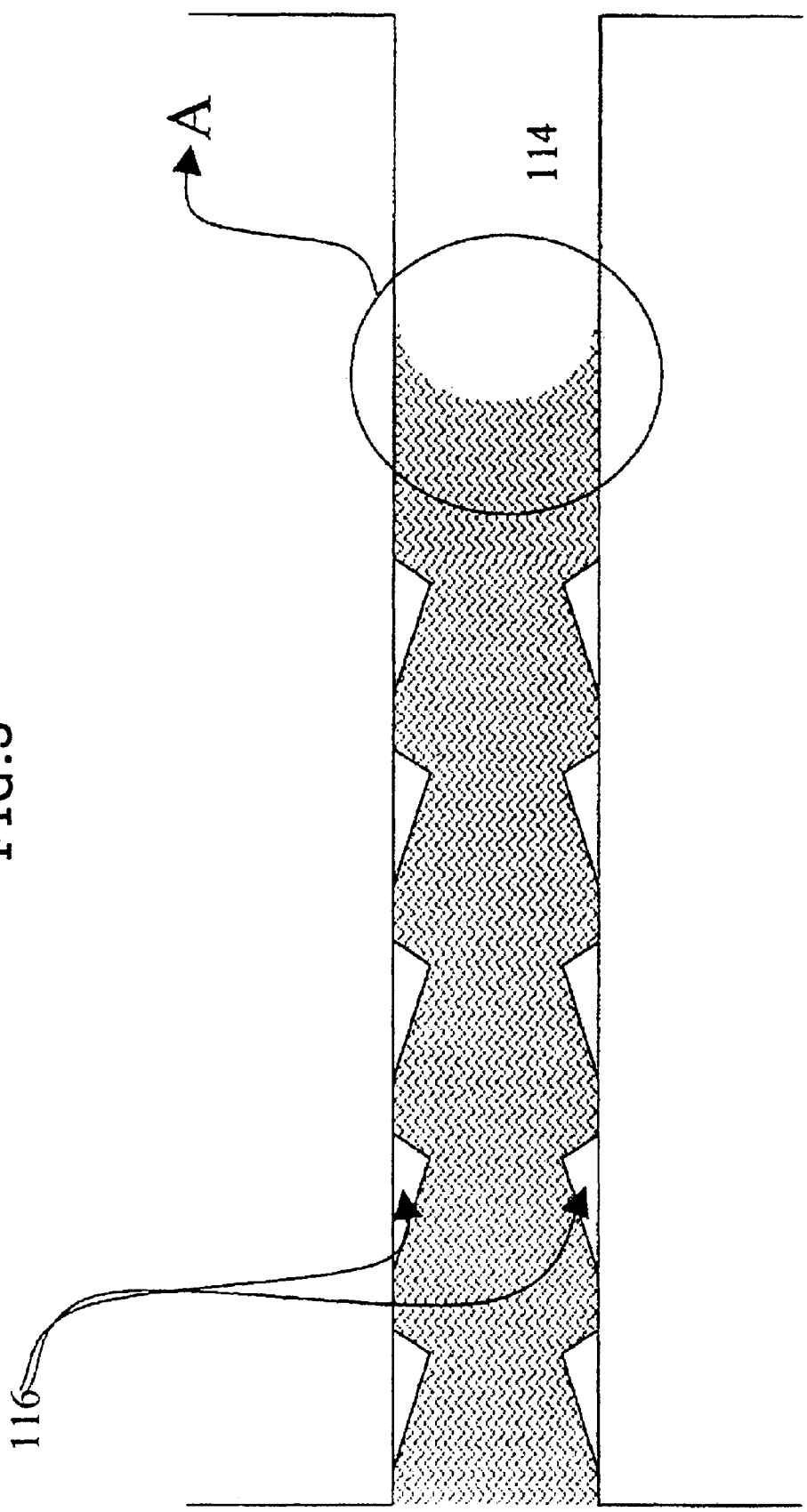
FIG. 3 is an enlarged schematic view for illustrating one of micro channels in a heat absorbing part of the cooling device shown in FIG. 1.

Next, operational processes of the cooling device 100 will be described with reference to FIGS. 1 through 3. As shown in FIG. 1, a heat transferring direction is illustrated in block arrows 120 and 122. Heat generated by the external heat generating source (not shown) is conveyed to the heat absorbing part 106 of the cooling device 100. It is preferred that a thermal contact is kept between the external heat generating source and the external wall of the housing 112 of the cooling device 100 where the heat absorbing part 106 is neighbored.

The housing 112 can be made of a variety of materials including semiconductor materials like silicon Si or Gallium Ga, layering materials like self-assembled mono-layer, metals like copper Cu or aluminum Al or either alloy, ceramics or crystalline materials like diamond. Especially, if the external heat generating source is a semiconductor device, the cooling device 100 of the present invention can be made of the same semiconductor material used for the semiconductor device. The cooling device 100 of the present invention, as will be described below, can be integrally manufactured as one of the following fabrication processes. Therefore, the cooling device 100 can be made in the same size (for instance, several or tens of square centimeters of area in XY plane) as the external heat generating source, so that the thermal resistance in the cooling device 100 of the present invention can be minimized.

As shown in FIG. 2, the heat transferred from the external heat generating source is absorbed at the heat absorbing part 106. As shown in FIG. 2, the heat absorbing part 106 has a plurality of micro channels 114, and the coolant stored in the coolant storing part 102 is filled up to a predetermined portion of the channels 114 according to the capillary phenomenon. This is illustrated in detail in FIG. 3. As shown in FIG. 3, which is an enlarged view for schematically illustrating one of the micro channels 114 of the heat absorbing part 106, the coolant fills from the coolant storing part 102 up to a position designated as "A" of the micro channel.

The position "A" in which the coolant is filled depends on type of the coolant and dimension of the micro channels 114. Particularly, the type of coolant may be different according to the material of the housing 112 because the coolant may go through a chemical reaction with the surface of micro channels 114 or housing 112. In consideration of environment pollution, a non-CFC type of new coolant may be preferred. As a coolant compatible with the material of the housing 112, for instance, in the electronic products like integrated circuit, water $H_2O$, or alcohol like methanol or ethanol may be preferably selected. The large thermal capacity of the aforementioned coolant and its small surface tension angle with a semiconductor device result in a great flow rate of the coolant to transfer great quantity of heat. Furthermore, there is no problems related to environment pollution. Even when there is a defect in the housing 112 (for instance, a fine crack on the surface of the housing), it is less probable that the coolant will be discharged out of the housing 112.

In general, though there is surface tension in macroscopic system, an influence of the gravity force is superior. Therefore, it is difficult to efficiently take an advantage of the surface tension in macroscopic system. In order to make the influence of the gravity force negligible, the size of the system gets smaller. Thus, preferably, the width of each micro channels 114 suitable to the cooling device 100 of the present invention is approximately within a range of 1 nm to 1000 um, and the length of the channels 114 is approximately within a range of 0.5 to 5 cm. In addition, the cross-sectional surface of the each micro channel 114 may be formed in circle, oval, rectangle, square, multi-angular shape, etc. As described below, the cross-sectional area may get larger or smaller in a predetermined direction to control the magnitude of the surface tension between the internal wall of the channels 114 and coolant.

As described above, if heat is applied from the external heat generating source to the micro channels 114 of the heat absorbing part 106 filled with coolant, fine bubbles are generated by evaporation of some coolant filled in the micro channels 114, so that there forms turbulence in the coolant. Such fine bubbles and turbulence in the coolant generate more fine bubbles (not shown) in the micro channels 114. These fine bubbles move to gas moving part 104 where no coolant is stored. Since the bubbles move only in a distance of only several millimeters, the influence of the gravity can be negligible. Therefore, even if the coolant storing part 102 and gas moving part 104 are respectively positioned at high and low places, the bubbles can move to the gas moving part 104 from the coolant storing part 102 due to the difference in pressure in the heat absorbing part 106. The movement of the bubbles is described in detail hereinafter.

The aforementioned movement of the bubbles having a predetermined direction can be established by the nodes 116 formed on the internal surface of the micro channels 114 in the heat absorbing part 106. In other words, as shown in FIG. 3, a plurality of nodes 116 are protruded on the internal surface of the micro channels 114 in a zone close to the coolant storing part 102. As the cross-sectional area of the micro channel 114 gets smaller to the direction toward the gas moving part 104 (that is, in the increasing direction of the X axis) in which the surface tension gets larger in such a direction. The aforementioned increase in the surface tension enables the coolant to have potential energy which causes coolant to move in the direction from the coolant storing part 102 to the gas moving part 104. In summary, according to the directional potential energy of the coolant, most of the bubbles generated in the coolant tend to move in an increasing direction of the X axis.

As shown in FIG. 1, the gas moving part 104 is formed as an empty space at first. The bubbles moved from the heat absorbing part 106 to the gas moving part 104 break into gases (gaseous coolant). As the gaseous coolant erupts out of the heat absorbing part 106, the gaseous coolant moves to the condensing part 110 due to the difference in pressure at the zone adjacent to the heat absorbing part 106 and the condensing part 106.

As the number of the bubbles in a unit volume is increased, the cooling efficiency of the cooling device of the present invention is increased. Therefore, it is preferable to increase the possibility of generation of such bubbles. For example, a plurality of micro grooves (not shown) may be formed on the internal surface of the channels 114 in the heat absorbing part 106. Alternatively, a microwave generator (not shown) may be used to provide microwave energy to the cooling device 100 for finely vibrating the cooling device thereby increasing the possibility of bubble generation.

Then, the gas coolant loses its vaporization energy in the condensing part 110 to change into liquid state coolant. In order to more efficiently carry out condensation of the coolant, a plurality may be mounted on the external surface of the housing 112 close to the condensing part 110. The aforementioned fins may be made in microscopic size. Further, for instance, if micro actuators are made together with the micro fins, the heat discharged out of the condensing part 110 can be recycled to circulate surrounding air. Or, if the fin is made of a thermoelectric device, the heat discharged out of the condensing part 110 can be transformed into electrical energy which can be used for other electronic devices. Furthermore, in accordance with another embodiment of the present invention, the condensing part 110 may be formed bigger than that of the heat absorbing part 106 (for instance, about 10 times), so that convection of surrounding atmosphere can also be helpful for condensation of the gaseous coolant. Further, micro fins may be formed on the inside surface of the condensing part 110, thereby increasing the condensing efficiency of the coolant.

In the condensing part 110, the gaseous coolant is condensed and collected into liquid coolant. When enough liquid coolant is collected, the liquid coolant moves to the coolant storing part 102 through the micro channels formed in the condensing part 110. The condensed coolant moves to the coolant storing part 102 under the same principle as described above. Similar to the structure of the heat absorbing part 106, the channels in the condensing part 110 may include a plurality of nodes 118 on the inside surface in a zone adjacent to the gas moving part 104. At this time, the nodes 118 are formed in an opposite direction to those 116 formed in the heat absorbing part 106. The coolant condensed into liquid returns to the coolant storing part 102, thereby completing the circulation of the coolant in the cooling device 100.

As described above, the circulation of the coolant in the cooling device 100 of the present invention is carried out in itself without external driving force, especially through the capillary phenomenon by surface tension of the liquid coolant, overcome the influence of gravity. As a plurality of micro channels 114 are included in the heat absorbing part 106, the surface tension is greater than gravity in such cases.

As micro dynamics are applied in the present invention, there are a variety of methods to make the cooling device 100 of the present invention. For instance, there may be used MEMS(micro electro mechanical system) or SAM(self assembled mono-layer) method, or a super-precision structure manufacturing method using laser or plasma.

Figure 4:
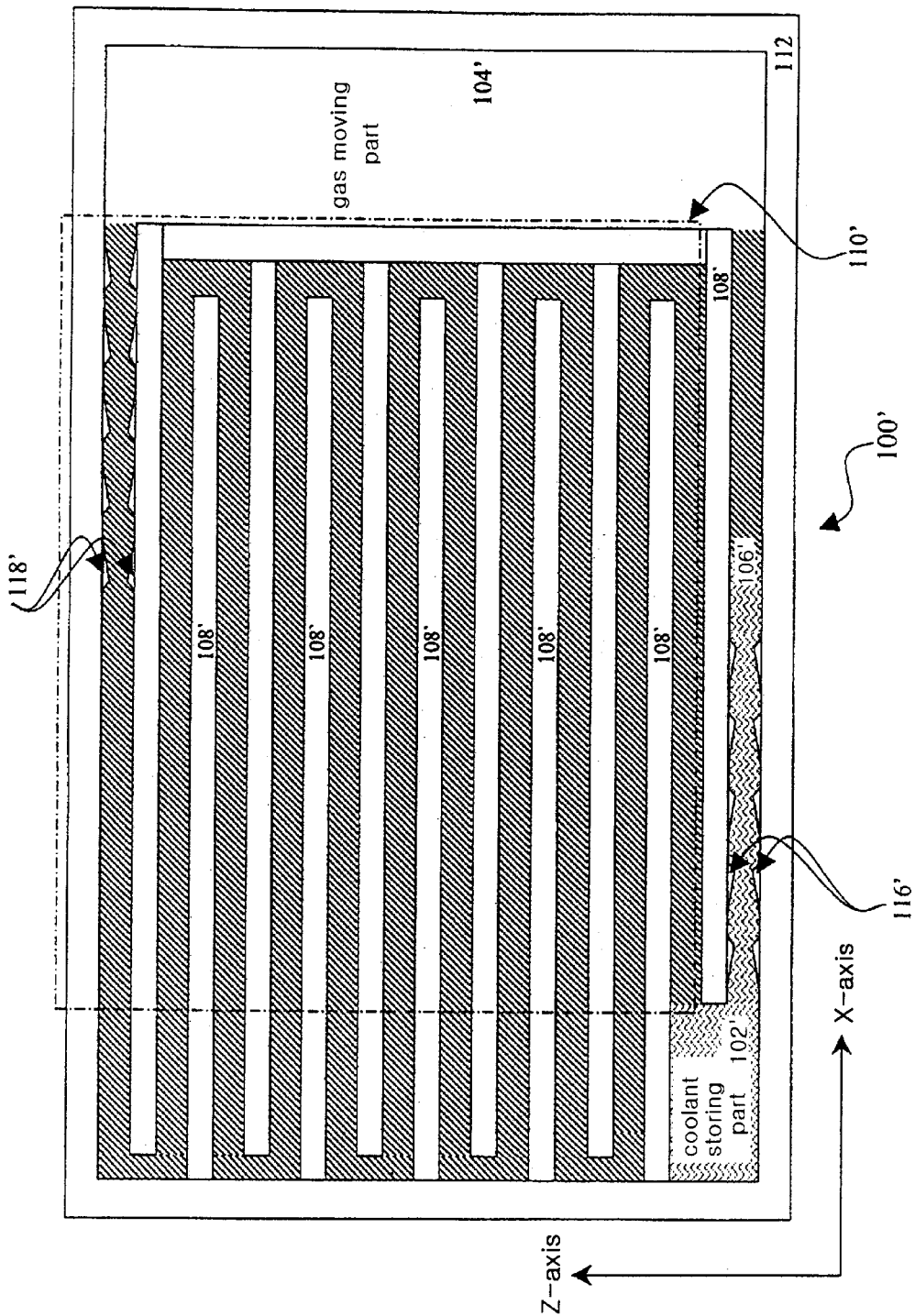
FIG. 4 is a cross-sectional view for illustrating a cross-section of an XZ plane of the cooling device 100' in accordance with another embodiment of the present invention.

Now, another embodiment of the present invention will be described with reference to FIG. 4, which is a cross-sectional view for illustrating the XZ plane of the cooling device 100' in accordance with another embodiment of the present invention. As shown in the drawing, the cooling device 100' can be formed in a multi-layered structure with expansion of the mono-layered structure of the cooling device 100.

The coolant circulation of the cooling device 100' is described as below. The coolant turns into gas by the heat absorbed in the heat absorbing part 100' and the gaseous coolant begins to move by the same mechanism as described in the mono-layered structure of the cooling device 100. Then, the coolant, as much as what has flowed out of the coolant storing part 102,' re-fills from the condensing part 110' to the coolant storing part 102' according to the principle of continuity. The gaseous coolant turns into liquid coolant again at the condensing part 110' through the gas moving part 104', so that the amount of the coolant, which flowed into the coolant storing part 102' from the condensing part 110', is compensated. Thereby, the circulation of the coolant in the cooling device 100' is completed.

As shown in the drawing, the cooling device 100' is different from the cooling device 100 in the multi-layered structure of the condensing part 110', but all the essential principles, such as circulation of the coolant, phase changes or heat generation, are the same in both cooling devices 100 and 100'. The multi-layered structure of the condensing part 110' includes a plurality of micro channels (slant zones) and is divided by the insulating part 108'. A plurality of nodes 118' are formed for inducing the directional characteristics of the coolant in the micro channels. Of course, such nodes may be formed in the internal surface of all the micro channels of the condensing part 110' to strongly keep a predetermined directional characteristics. Similarly in the mono-layered structure of the cooling device 100, nodes 116' may also be formed in the heat absorbing part 106' to induce the directional characteristics of the coolant.

As described above, a plurality of layers of the condensing parts 110' are formed to improve the condensation efficiency of coolant, thereby improve cooling efficiency of the cooling device 100'.

In accordance with the present invention, there is provided a microscopic cooling device having a characteristic of a high efficient heat cooling, which also improves performances and reliability of products with the cooling device of the present invention.

Having described specific preferred embodiments of the invention, it is to be understood that the invention is not limited to those disclosed embodiments, and that various changes and modifications may be effected therein by one skilled in the art without departing from the scope or spirit of the invention as defined in the appended claims.

For example, the subject matter of the present invention may be embodied in a cooling device which includes a separate housing for the coolant storing part or the condensing part interconnected with the heat absorbing part through tubes as the gas moving part. In this particular embodiment, the size of the separate housing can be larger than the heat absorbing part, so that the condensing efficiency can be increased.

Alternatively, the above described parts of the cooling device of the present invention may be formed on a plane, so that the thickness of the cooling device can be reduced. In this particular embodiment, the heat absorbing part and the condensing part are formed on, for example, the XY plane, thermally insulated from each other by the insulation part which is also formed on the same XY plane, and connected with each other through coolant storing part and the gas moving part also formed on the same XY plane.

Further, the micro channels in the heat absorbing part may be formed as curved lines rather than straight lines.

What is claimed is:

1. A cooling device which discharges heat generated by a heat generation source, said cooling device comprising:
    a coolant contained and circulated in said cooling device, the coolant comprising liquid coolant and gaseous coolant;
    a coolant storing part stores said liquid coolant, the coolant storing part including first and second ends;
    a heat absorbing part comprising at least one first micro channel connected to the first end of said coolant storing part, in which said liquid coolant is partly filled up to a predetermined portion of said first micro channel by surface tension between said liquid coolant and an internal wall of said first micro channel and surface tension force is greater than gravitational force within said first micro channel;
    a condensing part for condensing said gaseous coolant to said liquid coolant, the condensing part comprising at least one second micro channel connected to the second end of said coolant storing part apart from said first micro channel,
    a gas moving part being connected to said first micro channel and said second micro channel and adapted to be a passage through which said gaseous coolant moves from said first micro channel to said second micro channel;
    a housing enveloping said coolant storing part, said heat absorbing part, said condensing part and said gas moving part;
    wherein when heat is applied from a heat generating source to said first micro channel, said liquid coolant partly filled in said first micro channel being vaporized to a gaseous state and simultaneously said liquid coolant stored in said coolant storing part being continuously supplied into said first micro channel by capillary force, to thereby allow said coolant to be circulated within said first and second micro channels in said housing of said cooling device; and
    a heat insulating element positioned between said heat absorbing part and said condensing part to prevent heat transfer therebetween.

2. The cooling device as claimed in claim 1, wherein said housing is comprised of a material selected from the group consisting of a semiconductor material, a self-assembled mono-layer, a metal, a metal alloy, a ceramic material and a crystalline material.

3. The cooling device as claimed in claim 2, wherein said heat generating source has a surface and an external surface of said first micro channel is made of the same material as a surface material of said heat generating source.

4. The cooling device as claimed in claim 1, wherein said first and second micro channels are made at a range of about $10^{-9}$ m to about $10^{-3}$ m in width.

5. The cooling device as claimed in claim 4, wherein said first and second micro channels are made at a range of about 0.5 cm to about 5 cm in length.

6. The cooling device as claimed in claim 1, wherein said first micro channel has at least one node on said internal surface thereof, thereby making cross-sectional area of said first micro channel smaller toward said gas moving part from said coolant storing part.

7. The cooling device as claimed in claim 6, wherein said node is protruded on the internal surface of said first micro channel in a zone close to said coolant storing part.

8. The cooling device as claimed in claim 1, wherein said second micro channel has at least one node on said internal surface thereof, whereby making cross-sectional area of said second micro channel smaller toward said coolant storing part from said gas moving part.

9. The cooling device as claimed in claim 8, wherein said node is protruded on the internal surface of said second micro channel in a zone close to said gas moving part.

10. The cooling device as claimed in claim 1, wherein said second micro channel has at least one tapered part on said internal surface thereof, whereby making cross-sectional area of said second micro channel smaller toward said coolant storing part from said gas moving part.

11. The cooling device as claimed in claim 1, wherein volume of said second micro channel of said condensing part is larger than that of said first micro channel of said heat absorbing part.

12. The cooling device as claimed in claim 1, wherein a plurality of fins are formed on the external surface of said housing of second micro channel adjacent to said condensing part for enhancing heat dissipation.

13. The cooling device as claimed in claim 12, wherein said fins are made of a thermoelectric device.

14. The cooling device as claimed in claim 12, wherein said fins are made together with micro actuators.

15. The cooling device as claimed in claim 1, wherein a plurality of fins are formed on the internal surface of said housing of said second micro channel adjacent to said condensing part.

16. The cooling device as claimed in claim 1, wherein a plurality of micro grooves are formed on the internal surface of said first micro channel of said heat absorbing part.

17. The cooling device as claimed in claim 1, wherein a microwave generator is used to provide microwave energy to said cooling device.

18. The cooling device as claimed in claim 1, wherein a plurality of micro grooves are formed on an internal surface of said second micro channel of said condensing part.

19. The cooling device as claimed in claim 1, wherein said heat absorbing part and said condensing part are formed on a same XY plane.

20. The cooling device as claimed in claim 1, wherein said heat absorbing part and said condensing part are formed on a same XZ plane and thermally insulated from each other.

21. The cooling device as claimed in claim 20, wherein the heat insulating element is positioned between said first micro channel and said second micro channel.

22. The cooling device as claimed in claim 1, wherein said first micro channel is formed as curved line.

23. The cooling device as claimed in claim 1, wherein said second micro channel is formed as curved line.

24. The cooling device as claimed in claim 1, wherein the cooling device is operational regardless of its positional orientation.

* * * * *